United States Patent
Sen et al.

(10) Patent No.: US 6,754,616 B1
(45) Date of Patent: Jun. 22, 2004

(54) METHOD OF EMULATING AN IDEAL TRANSFORMER VALID FROM DC TO INFINITE FREQUENCY

(75) Inventors: Bidyut K. Sen, Milpitas, CA (US); James C. Parker, deceased, late of Pleasanton, CA (US), by Rosanne Parker, executrix; Richard L. Wheeler, Pleasanton, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/494,821

(22) Filed: Jan. 31, 2000

(Under 37 CFR 1.47)

(51) Int. Cl.$^7$ ................................................ G06G 7/62
(52) U.S. Cl. ............................ 703/13; 703/14; 703/18; 703/23; 716/1; 716/11
(58) Field of Search ............................ 703/14, 18, 13; 716/1, 11

(56) References Cited

U.S. PATENT DOCUMENTS

| | | | | |
|---|---|---|---|---|
| 4,232,280 A | * | 11/1980 | Forward | 333/213 |
| 5,016,204 A | * | 5/1991 | Simoudis et al. | 703/14 |
| 5,084,824 A | * | 1/1992 | Lam et al. | 716/11 |
| 5,548,526 A | | 8/1996 | Misheloff | 364/491 |
| 5,572,435 A | * | 11/1996 | Kaltenecker | 716/1 |

FOREIGN PATENT DOCUMENTS

JP          02262311 A    * 10/1990    ............ H01F/27/00

WO          WO 93/13581   * 12/1992    ............ H02H/1/00

OTHER PUBLICATIONS

"A Spice Model for the Ideal Transformers", J. Coelho, Electronic Design, pp. 85, Jun. 28, 1999.*

"Spice simulation of an ideal transformer", J. Van de Spiegel, University of Pennsylvania, Aug. 1, 1995.*

(List continued on next page.)

*Primary Examiner*—W. Thomson
*Assistant Examiner*—Fred Ferris
(74) *Attorney, Agent, or Firm*—Sheppard Mullin Richter & Hampton LLP

(57) ABSTRACT

A method of simulating the electrical behavior of an ideal transformer. The representation of the ideal transformer is frequency independent and can be used to simulate the behavior of an ideal transformer over the frequency range from DC to infinity. In one embodiment, the ideal transformer is represented as having an input sub-circuit and an output sub-circuit. Each sub-circuit includes a resistor connected in parallel across a current controlled current source. The input current, output current, current sources, and resistances are scaled by a scaling factor representing the turns ratio between the primary and secondary windings of a physical transformer. In the present invention, the current sources are responsible for the current scaling and the resistors are responsible for the impedance scaling. The circuit elements of the representation may be used as the basis for generating a set of input parameters for a circuit emulation program.

16 Claims, 2 Drawing Sheets

OTHER PUBLICATIONS

"Modeling of Electrical Circuits with Modelica", C. Claub, Fraunhofer Institute for Integrated Circuits, Mar. 1996.*

"Coupled Inductance and Reluctance Models of Magnetic Components", G. Ludwig, IEEE Transactions of Power Electronics, vol. 6, No. 2, Apr. 1991.*

"Unique Solvability of Linear Memoryless Networks—A Survey", A. Recski, IEEE Transactions on Circuits and Systems, vol CAS–31, No. 10, Oct. 1984.*

"A Saturating Transformer Model for SPICE," Daniel R. Rumsey, Ph.D., *Proceedings of the 15th Intersociety Energy Conversion Engineering Conference*, pps. 95–99 (1980).

"A Computer Model of Magnetic Saturation and Hysteresis for Use on SPICE2," Disheng Pei and Peter O. Lauritzen, *IEEE Transactions on Power Electronics*, vol. PE–1, No. 2, pps. 101–110 (Apr., 1986).

"New Simulation Techniques Using SPICE," L. G. Meares, *IEEE Applied Power Electronics Conference and Exposition—Conference Proceedings* (1986).

"CAE Tools Model Power–Supply Parts," Stephan Ohr, *Electronic Design*, pps. 71–72 (1986).

"Transformer Model for SPICE and Simulation of a Push–Pull Quasi–Resonant DC–DC Converter, Mark Lee, " *Proceedings of the 23rd Intersociety Energy Conversion Engineering Conference*, pps. 481–486, vol. 3 (1998).

"Computer–Aided Analysis of Electronic DC–DC Transformers," Yim–Shu Lee and Y. C. Cheng, *IEEE Transactions on Industrial Electronics*, vol. 35, No. 1, pps. 148–152 (1988).

"The MSPICE Simulation of a Saturating Transformer,", David N. Maclean, *Proceedings of the 24th Intersociety Energy Conversion Engineering Conference*, pps. 105–110 (1989).

"A SPICE Model of Orthogonal–Core Transformers," O. Ichinokura, K. Sasto and J. Jinjenji, *Journal of Applied Physics*, vol. 69, No. 8, Pt. 2A, pps. 4928–4930 (1991).

"PSPICE and Circuit Analysis," John Keown, *AC Circuit Analysis (for Sinusoidal Steady–State Conditions)*, Merrill/Macmillan Publishing Company, pps. 69–70 (1991).

"Computer–Aided Circuit Analysis Using PSpice®; Appendix B—Transformers and PSpice Switches," Walter Banzhaf, Regents/Prentice Hall, pps. 251–254 (1992).

"Macromodeling with SPICE; Section 3.2.5—Ideal Transformer," J. Alvin Connelly, Pyung Choi, Prentice Hall, pps. 51–52 (1992).

"SPICE: A Guide to Circuit Simulation and Analysis Using PSpice®; Appendix C—Abridged Summary of PSpice Devices," Paul W. Tuinenga, Prentice Hall, p. 237 (1992).

"Improved Spice Model Simulates Transformer's Physical Processes," L. G. Meares and Charles E. Hymowitz, *EDN*, pps. 106–114 (1993).

"Analytical and New Transmission Line Equivalent Circuit Modelling Methods for Swept Frequency of Power Transformers," N. Al–Khayat and L. Haydock, *Second Internal Conference on Computation in Electromagnetics*, pps. 123–126 (1994).

"PSPICE Computer Modeling of Power Transformers with Hysteresis Effects," Stephen Prigozy, *Computers in Education Journal*, vol. 4, No. 2, pps. 68–76 (1994).

* cited by examiner

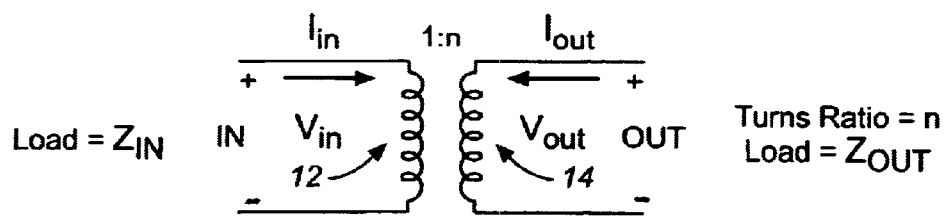
FIG._1 (PRIOR ART)
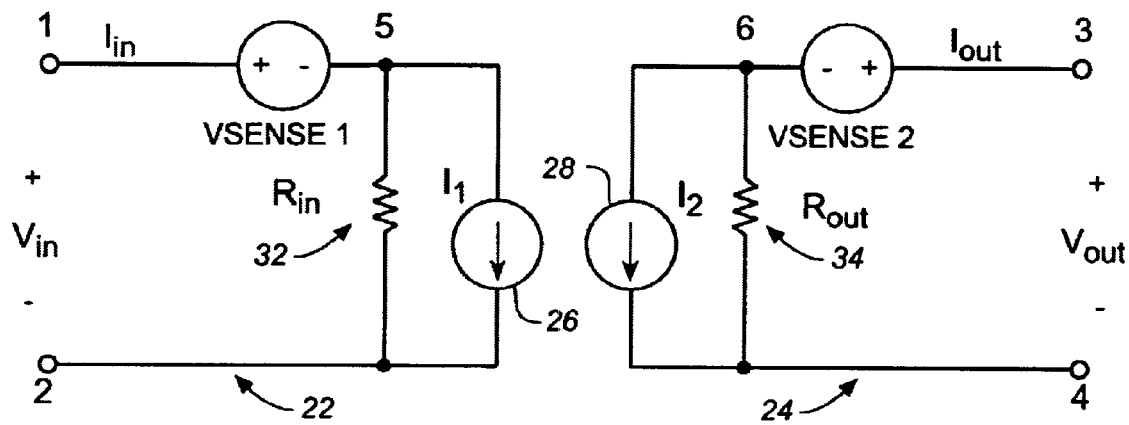
FIG._2
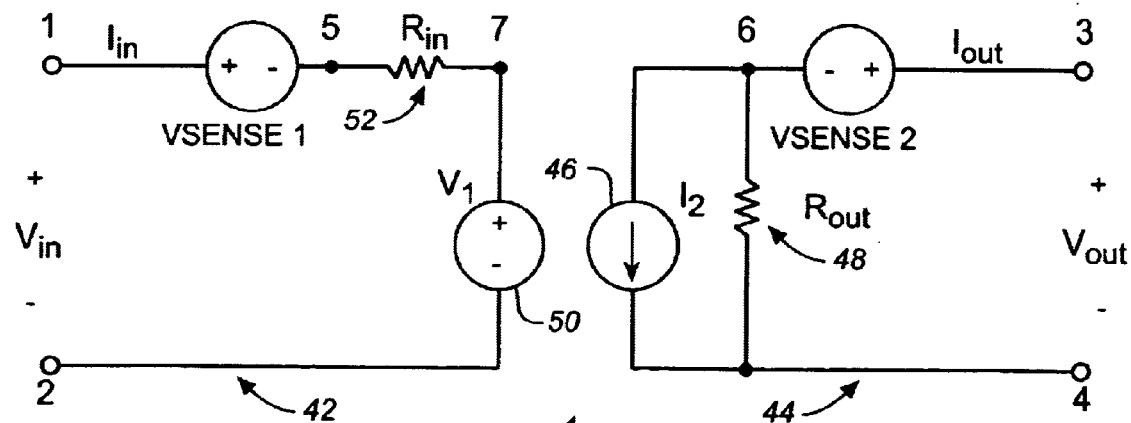
FIG._3

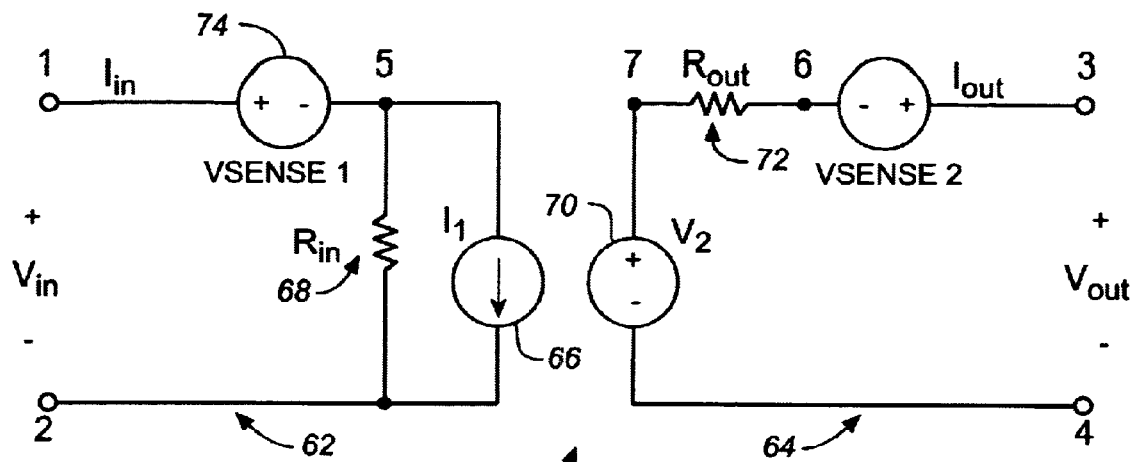
FIG._4
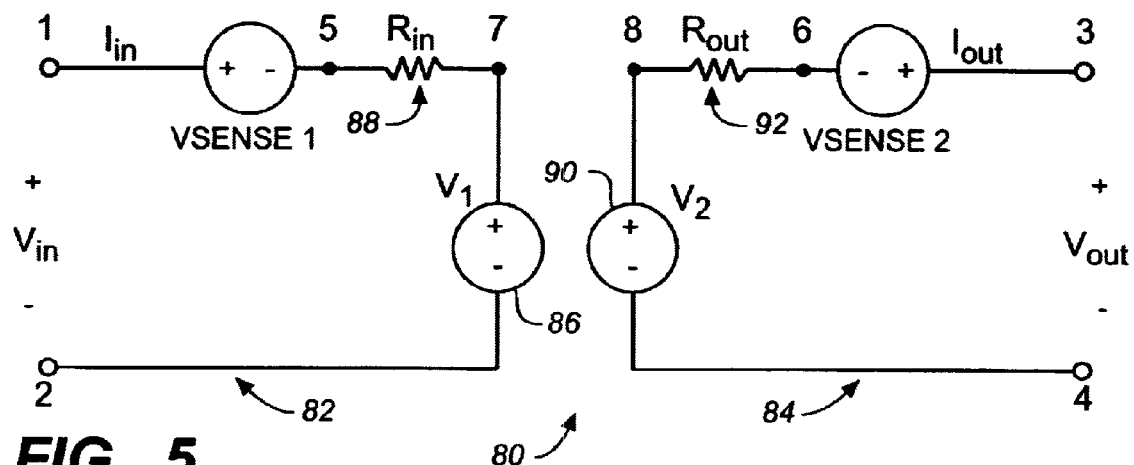
FIG._5

US 6,754,616 B1

METHOD OF EMULATING AN IDEAL TRANSFORMER VALID FROM DC TO INFINITE FREQUENCY

BACKGROUND OF THE INVENTION

1. Field of the Invention

The present invention relates to methods of simulating the behavior of circuit components to assist with the design of semiconductor devices, and more specifically, to a method of emulating an ideal transformer which is valid over a frequency range from DC to infinity.

2. Description of the Prior Art

Circuit simulation techniques are used in the semiconductor industry as an alternative to breadboarding the actual circuit designs. In many instances, the computer models used to emulate integrated circuit components have been found to accurately model device behavior that could not be duplicated using breadboard based versions of the components. This is because the breadboard parasitics dominate the characteristics of the microcircuit geometries, making it difficult to isolate the behavior of the actual circuit components from the effects of the breadboard. A well known circuit simulation program currently available is the SPICE program. This program is used for analyzing the operation of circuit elements and combinations of such elements.

One of the circuit elements which it is advantageous to be able to model is an ideal transformer. An ideal transformer can be used to perform an impedance transformation between two sub-circuits of an electrical circuit. An impedance transformation conserves the power transferred between the primary and secondary windings (i.e., the input and output sides) of the transformer, but takes into account that the two windings present different impedances to their respective sub-circuits by scaling the impedance. An ideal transformer may also be used in situations in which the inductance and losses of a real transformer can be neglected. Typically, an ideal transformer is represented as a pair of inductors which are coupled together with a magnetic coupling coefficient of unity, i.e., "perfect"coupling. The inductors represent the primary and secondary windings, respectively, of the ideal transformer.

FIG. 1 is a schematic diagram showing a representation of an ideal transformer 10 according to the prior art. Transformer 10 is represented as an input sub-circuit having two inputs (labeled "IN" in the figure) and an output sub-circuit having two outputs (labeled "OUT"in the figure). As shown in the figure, the sub-circuits of transformer 10 are represented or modeled as a first inductor 12 and a second inductor 14, with the two inductors being magnetically coupled together. Inductor 12 contains $N_1$ turns, while inductor 14 contains $N_2$ turns. If the turn ratio (i.e., $N_2/N_1$) between the two inductors is defined as (n), then the voltage across the ideal transformer increases from the input side to the output side by a factor of n, while the current across the transformer decreases by a factor of n. Thus, for the ideal transformer of FIG. 1, $V_{out}=(n) V_{in}$ and $I_{out}=-(1/n) I_{in}$. This scaling of the voltage and current across the transformer conserves power between the transformer input and output. The impedance across the transformer increases by a factor of $n^2$ and produces no phase shift in the input signal.

However, the ideal transformer of FIG. 1 has limitations. It does not properly represent the behavior of an actual transformer at DC since the impedance of an inductor at DC is zero. In addition, representing a transformer using inductors is computationally time consuming for low frequency calculations. This is because of the computer time needed to solve the cross-coupled differential equations which result from the FIG. 1 representation of a transformer.

What is desired is a method of emulating the behavior of an ideal transformer which is valid over the frequency range from DC to an infinite frequency.

SUMMARY OF THE INVENTION

The present invention is directed to methods of representing an ideal transformer and simulating the behavior of an electrical circuit of which the ideal transformer is a part. The ideal transformer representation may be used to represent a transformer serving as a circuit element or to perform an impedance transformation between two parts of a circuit. In the broadest embodiments of the invention, the ideal transformer representations are frequency independent and can be used to emulate the behavior of a transformer over the frequency range from DC to infinity. In one embodiment, the ideal transformer is modeled as having an input sub-circuit and an output sub-circuit. Each sub-circuit comprises a resistor coupled in parallel with a current controlled current source. The current sources provide the current scaling and the resistors provide the impedance scaling. The input current, output current, current source currents, and resistances are scaled with the turns ratio between the primary and secondary windings of the ideal transformer. The circuit elements of each inventive representation of an ideal transformer can be used as the basis for generating a set of input parameters (or input deck) for a circuit emulation program.

BRIEF DESCRIPTION OF THE DRAWINGS

FIG. 1 is a schematic diagram showing a representation of an ideal transformer according to the prior art.

FIG. 2 is a schematic diagram of a first embodiment of a representation of an ideal transformer used in the method of the present invention.

FIG. 3 is a schematic diagram of a second embodiment of a representation of an ideal transformer used in the method of the present invention.

FIG. 4 is a schematic diagram of a third embodiment of a representation of an ideal transformer used in the method of the present invention.

FIG. 5 is a schematic diagram of a fourth embodiment of a representation of an ideal transformer used in the method of the present invention

DETAILED DESCRIPTION OF THE PREFERRED EMBODIMENT

The present invention is directed to a method of representing an ideal transformer which can be used to analyze the behavior of an electrical circuit which is simulated by including such an element. Typically, when using circuit analysis software such as SPICE, a set of characteristics or input parameters (sometimes termed an input "deck") is provided for each circuit element. The set of characteristics is based on a schematic which represents the circuit element. The set of characteristics is provided to the circuit analysis software and is then used by the computer program to analyze the performance of a circuit of which the element is a part. Thus, for each of the embodiments of the present invention which will be described, a corresponding set of input parameters or device description characteristics can be generated and used to simulate the behavior of an ideal transformer, either in isolation or as part of a more complicated circuit.

FIG. 2 is a schematic diagram of a first embodiment of a representation of an ideal transformer used in the method of the present invention. As shown in the figure, transformer 20 is represented as an input sub-circuit 22 connected to other circuit elements at nodes 1 and 2 and an output sub-circuit 24 connected to other circuit elements at nodes 3 and 4. Sub-circuits 22 and 24 are each composed of a current-controlled current source (CCCS) 26 and 28, respectively, coupled in parallel with a resistor, $R_{in}$ 32 and $R_{out}$ 34, respectively. Current $I_{in}$ is the current flowing in the circuit branch between nodes 1 and 5, while $I_{out}$ is the current flowing in the circuit branch between nodes 3 and 6. When using a circuit emulation program such as SPICE, these currents are measured by inserting an independent voltage source of value equal to zero volts into the branch. In the figure, the independent voltage sources are represented by VSENSE1 and VSENSE2. Current $I_1$ is the current supplied by current source 26, while current $I_2$ is the current supplied by current source 28. In the present invention, current sources 26 and 28 provide the current scaling, while resistors 32 and 34 provide the desired impedance scaling between sub-circuits 22 and 24. For the embodiment shown in FIG. 2, the input and output currents ($I_{in}$ and $I_{out}$), the currents of the current-controlled current sources ($I_1$ and $I_2$, respectively), and $R_{in}$ 32 and $R_{out}$ 34 are related according to:

$$I_1 = -n \times I_{out}$$

$$I_2 = -1/n \times I_{in}$$

$$R_{out} = n^2 \times R_{in},$$

where n is a scaling factor which may be compared to the turns ratio of the primary and secondary windings of a physical transformer, and $I_{out}$ is measured by the zero volt voltage source VSENSE2 connected in series with output node 3. These relationships preserve the power conservation and impedance scaling of an ideal transformer. The magnitude of resistors 32 and 34 should be sufficiently large compared to the impedance connected externally to the input (across nodes 1 and 2) and output (across nodes 3 and 4) to dominate the overall impedance of the ideal transformer sub-circuits. This may be expressed as $R_{in} >> |Z_{in}|$ and $R_{out} >> |Z_{out}|$, where $Z_{in}$ is the impedance connected to input nodes 1 and 2 and $Z_{out}$ is the impedance connected to output nodes 3 and 4. However, the magnitude of resistors 30 and 32 may be limited by the need to prevent numerical round-off errors when using SPICE or another modeling program.

Note that the values of resistors $R_{in}$ and $R_{out}$ can, in some circumstances, lead to the production of a non-ideal current. This non-ideal current is generally small in magnitude and can be used to simulate the hysteresis loss of a real transformer.

A SPICE program input deck for the embodiment of FIG. 2 and the case of n=2 (where, as defined previously, n is a scaling factor) is as follows:

| Element Name | Node Connect (+) | (−) | Parameter Values |
|---|---|---|---|
| Rin | 5 | 2 | 1 k |
| Rout | 6 | 4 | 4 k |
| VSENSE1 | 1 | 5 | 0 v |
| VSENSE2 | 3 | 6 | 0 v |
| FI1 | 5 | 2 | VSENSE2 \| −2.0 |
| FI2 | 6 | 4 | VSENSE1 \| −0.5 |

FIG. 3 is a schematic diagram of a second embodiment of a representation of an ideal transformer used in the method of the present invention. Ideal transformer embodiment 40 of FIG. 3 is again composed of an input sub-circuit 42 and an output sub-circuit 44. Output sub-circuit 44 is composed of a current-controlled current source 46 coupled in parallel with a resistor 48 (labeled "$R_{out}$" in the figure). However, in contrast with the embodiment of FIG. 2, input sub-circuit 42 is represented as a current-controlled voltage source 50 connected in series with a resistor 52 (labeled "$R_{in}$"in the figure). As with the embodiment of FIG. 2, VSENSE1 and VSENSE2 represent zero-volt voltage sources which serve the purpose of sensing the current in a branch of the circuit.

For the embodiment of FIG. 3, the voltage ($V_1$) of voltage source 50, current ($I_2$) of source 46, input current ($I_{in}$), output current ($I_{out}$), $R_{in}$ 52 and $R_{out}$ 48 are related according to:

$$V_1 = -n \times I_{out} \times R_{in}$$

$$I_2 = -1/n \times I_{in}$$

$$R_{out} = n^2 \times R_{in}$$

where again n is a scaling factor which may be compared to the turns ratio between the stages of a physical transformer, $I_{out}$ is measured by the zero volt voltage source (VSENSE2) connected in series with the output sub-circuit, and as before, $R_{in} >> |Z_{in}|$ and $R_{out} >> |Z_{out}|$.

A SPICE program input deck for the embodiment of FIG. 3 and the case of n=2 is as follows:

| Element Name | Node Connect (+) | (−) | Parameter Values |
|---|---|---|---|
| Rin | 5 | 7 | 1 k |
| Rout | 6 | 4 | 4 k |
| VSENSE1 | 1 | 5 | 0 v |
| VSENSE2 | 3 | 6 | 0 v |
| HV1 | 7 | 2 | VSENSE2 \| −2.0 |
| FI2 | 6 | 4 | VSENSE1 \| −0.5 |

FIG. 4 is a schematic diagram of a third embodiment of a representation of an ideal transformer used in the method of the present invention. Ideal transformer embodiment 60 of FIG. 4 is again composed of an input sub-circuit 62 and an output sub-circuit 64. Input sub-circuit 62 is composed of a current-controlled current source 66 connected in parallel with a resistor, $R_{in}$ 68. However, in contrast to the embodiment of FIG. 2, output sub-circuit 64 is modeled as a current-controlled voltage source 70 connected in series with a resistor 72 (labeled "$R_{out}$"in the figure).

For the embodiment of FIG. 4, the voltage source voltage ($V_2$), current source current ($I_1$), input current ($I_{in}$), output current ($I_{out}$) $R_{in}$ and $R_{out}$ are related according to:

$$I_1 = -n \times I_{out}$$

$$V_2 = -1/n \times I_{in} \times R_{out}$$

$$R_{out} = n^2 \times R_{in},$$

where n is the scaling factor, $I_{in}$ is measured by the zero volt voltage source 74 connected in series with input node 1, and as before, $R_{in} >> |Z_{in}|$ and $R_{out} >> |Z_{out}|$.

A SPICE program input deck for the embodiment of FIG. 4 and the case of n=2 is as follows:

| Element Name | Node Connect (+) | Node Connect (−) | Parameter Values |
|---|---|---|---|
| Rin | 5 | 2 | 1 k |
| Rout | 6 | 7 | 4 k |
| VSENSE1 | 1 | 5 | 0 v |
| VSENSE2 | 3 | 6 | 0 v |
| FI1 | 5 | 2 | VSENSE2 \| −2.0 |
| HV2 | 7 | 4 | VSENSE1 \| −2.0 |

FIG. 5 is a schematic diagram of a fourth embodiment of a representation of an ideal transformer used in the method of the present invention. Ideal transformer embodiment 80 of FIG. 5 is composed of an input sub-circuit 82 and an output sub-circuit 84. Input sub-circuit 82 is composed of a current-controlled voltage source 86 connected in series with a resistor 88 (labeled "$R_{in}$" in the figure). Output sub-circuit 84 is composed of a current-controlled voltage source 90 connected in series with a resistor 92 (labeled "$R_{out}$" in the figure).

For the embodiment shown in FIG. 5, the voltage source voltage ($V_1$), voltage source voltage ($V_2$), input current ($I_{in}$), output current ($I_{out}$), $R_{in}$, and $R_{out}$ are related according to:

$$V_1 = -n \times I_{out} \times R_{in}$$

$$V_2 = -1/n \times I_{in} \times R_{out}$$

$$R_{out} = n^2 \times R_{in},$$

where n is the scaling factor, and as before, $R_{in} >> |Z_{in}|$ and $R_{out} >> |Z_{out}|$.

A SPICE program input deck for the embodiment of FIG. 5 and the case of n=2 is as follows:

| Element Name | Node Connect (+) | Node Connect (−) | Parameter Values |
|---|---|---|---|
| Rin | 5 | 7 | 1 k |
| Rout | 6 | 8 | 4 k |
| VSENSE1 | 1 | 5 | 0 v |
| VSENSE2 | 3 | 6 | 0 v |
| HV1 | 7 | 2 | VSENSE2 \| −2.0 |
| HV2 | 8 | 4 | VSENSE1 \| −2.0 |

The inventors of the present invention have conducted a series of simulations to determine the accuracy of the ideal transformer model. This was done by using the various embodiments as the basis for a transformer element of a circuit and then simulating the circuit behavior using the SPICE circuit emulation software. The ideal transformer representations were shown to be very accurate in the frequency range from DC to 100 GHz. The present invention thus permits impedance transformations to be performed at all frequencies, including DC.

Several embodiments of a representation of an ideal transformer suitable for use with the present invention have been described. For example, the embodiment of FIG. 2 has current sources on both the input and output sides, that of FIG. 3 has a voltage source on the input side and a current source on the output side, that of FIG. 4 has a current source on the input side and a voltage source on the output side, and that of FIG. 5 has voltage sources on both the input and output sides. Mathematically, these representations are equivalent. The particular representation utilized will depend upon the simulation criteria of interest to a user. In this regard, one of skill can readily determine the appropriate embodiment which satisfies the needs of the simulation. For example, if the simulation requires use of a voltage source on the input side and a current source on the output side, then the embodiment depicted in FIG. 3 would be used.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. For example, although several embodiments of the invention have been described, other ideal transformer models based on Norton and Thevenin equivalents of the described circuits may also be used.

What is claimed is:

1. A method of simulating the electrical behavior of a transformer in an electrical circuit, the transformer having a primary winding port coupled between a first node and a second node of the electrical circuit, and a second winding port coupled between a third node and a fourth node of the electrical circuit, said method comprising the steps of:

simulating a first resistor coupled between the first and second nodes;

simulating a second resistor coupled between the third and fourth nodes;

simulating a first current-controlled current source (CCCS) coupled between the first and second nodes, the current flowing through said first CCCS from the first node to the second node plus the current flowing through said first resistor from the first node to the second node being denoted as current $I_{IN}$ and being capable of having a non-zero value; and simulating a second current-controlled current source (CCCS) placed between the third and fourth nodes, said second CCCS generating a current which is related to current $I_{IN}$, the current flowing through said second CCCS from the third node to the fourth node plus the current flowing through said second resistor from the third node to the fourth node being denoted as current $I_{OUT}$ and being capable of having a non-zero value;

wherein said first CCCS generates a current which is related to the current $I_{OUT}$.

2. The method of claim 1, wherein said first resistor has a resistance value of $R_{IN}$, said second resistor has a resistance value of $R_{OUT}$, the square root of the ratio $R_{OUT}/R_{IN}$ is represented by a ratio n, said first CCCS generates its current as $-n \cdot I_{OUT}$, and said second CCCS generates its current as $-I_{IN}/n$.

3. The method of claim 1, wherein the voltage at the primary winding port is designated as $V_{IN}$, the voltage across the secondary winding port is designated as $V_{OUT}$, an electrical behavior to be simulated by the method is to maintain the $V_{OUT}$ in proportion to the voltage $V_{IN}$ by a constant n ($V_{OUT} = nV_{IN}$), said first resistor has a resistance value of $R_{IN}$, and said second resistor has a resistance value of $R_{OUT} = n^2 R_{IN}$.

4. The method of claim 1, wherein each of the resistor components and the CCCS components are simulated by generating a SPICE record description of each element with an indication of its circuit node connections, storing each record in a computer storage memory, and inputting the stored records into a circuit simulation program capable of reading SPICE records.

5. The method of claim 1, wherein one of said first and second nodes is the same as one of said third and fourth nodes.

6. An article of manufacture which directs a circuit simulation program to simulate a transformer, said article comprising:

a computer readable medium;

a first record encoded on said medium for directing the simulation program to simulate a first resistor (Rin) that is coupled between a first node and a second node;

a second record encoded on said medium for directing the simulation program to simulate a first current-controlled current source (FT1) that is coupled between the first and second nodes;

a third record encoded on said medium for directing the simulation program to simulate a first independent voltage source (VSENSE1) that is coupled between a third node and one of the first and second nodes, and which measures the current flowing through the first independent voltage source;

a fourth record encoded on said medium for directing the simulation program to simulate second resistor (Rout) that is coupled between a fourth node and a fifth node;

a fifth record encoded on said medium for directing the simulation program to simulate a second current-controlled current source (FT2) that is coupled between the fourth and fifth nodes and which generates a current in relation to the current measured in the first independent voltage source; and a sixth record encoded on said medium for directing the simulation program to simulate a second independent voltage source (VSENSE2) that is coupled between a sixth node and one of said fourth and fifth nodes, and which measures the current flowing through said second independent voltage source;

wherein said second record is further encoded to cause said first current-controlled current source to generate its current in relation to the current flowing through the second independent voltage source.

7. The article of manufacture of claim 6, wherein the encoded records are readable by the SPICE circuit emulation program.

8. A method of simulating the electrical behavior of a transformer in an electrical circuit, the transformer having a primary winding port coupled between a first node and a second node of the electrical circuit, and a second winding port coupled between a third node and a fourth node of the electrical circuit, said method comprising the steps of:

simulating a series circuit coupled between the first and second nodes, said first and second nodes being separate from one another, said series circuit comprising a first resistor and a current-controlled voltage source (CCVS) coupled to one another in series to conduct a common current $I_{IN}$ from the first node to the second node;

simulating a second resistor coupled between the third and fourth nodes, said third and fourth nodes being separate from one another; and simulating a current-controlled current source (CCCS) placed between the third and fourth nodes, said CCCS generating a current which is related to current $I_{IN}$, the current flowing through said CCCS from the third node to the fourth node plus the current flowing through said second resistor from the third node to the fourth node being denoted as current $I_{OUT}$ and being capable of having a non-zero value, and said CCCS generating a current which is related to current $I_{IN}$;

wherein said CCVS generates a voltage which is related to the current $I_{OUT}$.

9. The method of claim 8, wherein said first resistor has a resistance value of $R_{IN}$, said second resistor has a resistance value of $R_{OUT}$, the square root of the ratio $R_{OUT}/R_{IN}$ is represented by a ratio n, said CCCS generates its current as $-I_{IN}/n$, and said CCVS generates its voltage as $-n \cdot R_{OUT} \cdot I_{OUT}$.

10. The method of claim 8, wherein the voltage across the primary winding port is designated as $V_{IN}$, the voltage across the secondary winding port is designated as $V_{OUT}$, an electrical behavior to be simulated by the method is to maintain the $V_{OUT}$ in proportion to the voltage $V_{IN}$ by a constant n ($V_{OUT}=nV_{IN}$), said first resistor has a resistance value of $R_{IN}$, and said second resistor has a resistance value of $R_{OUT}=n^2 R_{IN}$.

11. A method of simulating the electrical behavior of a transformer in an electrical circuit, the transformer having a primary winding port coupled between a first node and a second node of the electrical circuit, and a second winding port coupled between a third node and a fourth node of the electrical circuit, said method comprising the steps of:

simulating a first resistor coupled between the first and second nodes, said first and second nodes being separate from one another;

simulating a current-controlled current source (CCCS) coupled between the first and second nodes, the current flowing through said CCCS from the first node to the second node plus the current flowing through said first resistor from the first node to the second node being denoted as current $I_{IN}$ and being capable of having a non-zero value; and simulating a series circuit coupled between the third and fourth nodes, said third and fourth nodes being separate from one another, said series circuit comprising a second resistor and a current-controlled voltage source (CCVS) coupled to one another in series to conduct a common current $I_{OUT}$ from the third node to the fourth node, said CCVS generating a voltage which is related to current $I_{IN}$;

wherein said CCCS generates a current which is related to the current $I_{OUT}$.

12. The method of claim 11, wherein said first resistor has a resistance value of $R_{IN}$, said second resistor has a resistance value of $R_{OUT}$, the square root of the ratio $R_{OUT}/R_{IN}$ is represented by a ratio n, said CCCS generates its current as $-I_{IN}/n$, and said CCVS generates its voltage as $-n \cdot R_{OUT} \cdot I_{OUT}$.

13. The method of claim 11, wherein the voltage across the primary winding port is designated as $V_{IN}$, the voltage across the secondary winding port is designated as $V_{OUT}$, an electrical behavior to be simulated by the method is to maintain the $V_{OUT}$ in proportion to the voltage $V_{IN}$ by a constant n ($V_{OUT}=nV_{IN}$), said first resistor has a resistance value of $R_{IN}$, and said second resistor has a resistance value of $R_{OUT}=n^2 R_{IN}$.

14. A method of simulating the electrical behavior of a transformer in an electrical circuit, the transformer having a primary winding port coupled between a first node and a second node of the electrical circuit, and a second winding port coupled between a third node and a fourth node of the electrical circuit, said method comprising the steps of:

simulating a series circuit coupled between the first and second nodes, said first and second nodes being separate from one another, said series circuit comprising a first resistor and a first current-controlled voltage source (CCVS) coupled to one another in series to conduct a common current $I_{IN}$ from the first node to the second node;

simulating a series circuit coupled between the third and fourth nodes, said third and fourth nodes being separate from one another, said series circuit comprising a second resistor and a second current-controlled voltage source (CCVS) coupled to one another in series to conduct a common current $I_{OUT}$ from the third node to the fourth node, said second CCVS generating a voltage which is related to current $I_{IN}$;

wherein said first CCVS generates a voltage which is related to the current $I_{OUT}$.

15. The method of claim 14, wherein said first resistor has a resistance value of $R_{IN}$, said second resistor has a resistance value of $R_{OUT}$, the square root of the ratio $R_{OUT}/R_{IN}$ is represented by a ratio n, said first CCVS generates its voltage as $-n \cdot R_{IN} \cdot I_{OUT}$, and said second CCVS generates its voltage as $-1/n \cdot R_{OUT} \cdot I_{IN}$.

16. The method of claim 14, wherein the voltage across the primary winding port is designated as $V_{IN}$, the voltage across the secondary winding port is designated as $V_{OUT}$, an electrical behavior to be simulated by the method is to maintain the voltage $V_{OUT}$ in proportion to the voltage $V_{IN}$ by a constant n ($V_{OUT}=nV_{IN}$), said first resistor has a resistance value of $R_{IN}$, and said second resistor has a resistance value of $R_{OUT}=n^2 R_{IN}$.

* * * * *